(12) United States Patent
Yan

(10) Patent No.: US 6,593,041 B2
(45) Date of Patent: Jul. 15, 2003

(54) DAMASCENE EXTREME ULTRAVIOLET LITHOGRAPHY (EUVL) PHOTOMASK AND METHOD OF MAKING

(75) Inventor: Pei-yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 09/919,680

(22) Filed: Jul. 31, 2001

(65) Prior Publication Data

US 2003/0027053 A1 Feb. 6, 2003

(51) Int. Cl.⁷ .............................. G03F 9/00; G21K 5/00
(52) U.S. Cl. ................................... 430/5; 378/35
(58) Field of Search ...................... 430/5, 322, 323, 430/324; 378/34, 35

(56) References Cited

U.S. PATENT DOCUMENTS 5,935,737 A * 8/1999 Yan .............................. 430/5

* cited by examiner

*Primary Examiner*—S. Rosasco
(74) *Attorney, Agent, or Firm*—Blakely, Sokoloff, Taylor & Zafman LLP

(57) ABSTRACT

A photolithography mask for use with extreme ultraviolet lithography (EUVL) irradiation is disclosed. The mask comprises a multilayer stack that is substantially reflective of said EUV irradiation, a supplemental multilayer stack formed atop the multilayer stack, and an absorber material formed in trenches patterned into the supplemental multilayer stack. The absorber material being substantially absorptive of the EUV irradiation.

35 Claims, 4 Drawing Sheets

DAMASCENE EXTREME ULTRAVIOLET LITHOGRAPHY (EUVL) PHOTOMASK AND METHOD OF MAKING

TECHNICAL FIELD OF THE INVENTION

The present invention relates to photomasks, and more particularly, to a damascene structured photomask formed for use with extreme ultraviolet (EUV) light illuminating radiation.

BACKGROUND OF THE INVENTION

Photolithography is a common step used in the manufacture of integrated circuits and is typically carried out in a tool known as a "stepper". In photolithography, a silicon wafer substrate having a layer of film to be patterned is covered with a layer of photoresist. The wafer is then placed within a stepper onto a stage. A photomask is placed above and over the wafer. The photomask (also known as a reticle) contains the pattern that is to be replicated onto the wafer.

In the case of a transmissive photomask, the mask pattern is created by transmissive portions and absorbing portions arranged in the pattern on the mask. A selected wavelength, for example, 248 nanometers (nm), of irradiating radiation is shined through the mask. The transmissive portions of the mask, which are transparent to the selective wavelength, allow the light to pass through the mask. The absorbing portions, which are opaque to and absorb the selected wavelength, block the transmission. The pattern on the mask is thereby replicated onto the photoresist on the device wafer.

In another type of photomask, known as a reflective mask, the photomask surface contains reflective portions and absorbing portions. When light of a selected wavelength is applied to the photomask, the light is reflected off the reflecting portions. The reflected image from the mask usually is further reflected off of a mirror or lens system, then onto the wafer. Once exposed, the photoresist on the wafer is developed by rinsing in a solution that dissolves either exposed or unexposed portions of the photoresist, depending upon positive or negative tone of the photoresist, to create a pattern in the photoresist that matches the pattern of the photomask.

As device integration increases, the dimensions of features in the integrated circuit devices also must shrink. Therefore, the illuminating radiation used in photolithography must have shorter and shorter wavelengths to pattern successfully in shrinking dimensions. Patterning using 193 nm and 157 nm as wavelengths are all currently being developed. These wavelengths are generically known as the deep UV range (193 nm) and vacuum UV range (157 nm). However, EUV radiation is strongly absorbed generally by condensed matter, such as quartz. Thus, a reflective photomask is commonly used for EUVL.

Generally, the reflective mask consists of a multilayer stack of pairs of molybdenum and silicon thin films. The multilayer stack will reflect EUV radiation. Formed atop of the multilayer stack is a patterned absorptive metal layer. The patterned absorptive metal layer is patterned and etched from a blanket metal layer that is deposited onto the multilayer stack. This type of reflective mask is known as a subtractive metal reflective mask.

Another type of reflective mask is known as a damascene reflective mask. In this type of mask, trenches are formed in a silicon base layer that is deposited atop of the multilayer. The trenches are then filled with an absorptive metal layer. One such damascene reflective mask is described in detail in U.S. Pat. No. 5,935,733 to Scott et al. and assigned to the assignee of the present invention.

Specifically, turning to FIG. 1, a prior art photomask 101 is shown that includes a multilayer stack 103, a silicon base layer 105, a metal absorber layer 107, and a cap silicon layer 109. The multilayer stack 103 comprises alternating thin film layers of molybdenum (Mo) and silicon (Si). Typically, the multilayer stack 103 consists of 40 pairs of Mo/Si thin films, each pair of thin films approximately 7 nm in thickness. Next, the amorphous silicon base layer 105 is deposited onto the multilayer stack 103. Trenches are etched into the silicon base layer 105 and an absorbing metal 107 is deposited into the trenches. Finally, a silicon capping layer 109 is deposited to protect the photomask from damage.

In operation, incident EUV light 111 is reflected by the multilayer stack 103. Incident light on to the absorbing metal layer 107 is absorbed. This prior art photomask has several disadvantages. First, the silicon layer 105 tends to attenuate the amount of EUV light 111 that is reflected by the multilayer stack 103. For a 70 nm thickness of silicon, the attenuation is on the order of 22%. This attenuation will eventually lower the throughput of the stepper machine. In other words, a photoresist layer that may ordinarily take five seconds to expose, because of the attenuation in the silicon layer 105, may require six to seven seconds to expose.

A second disadvantage can be seen in FIG. 1 and is referred to as the shadowing effect. Because in EUVL, the incident radiation comes at an angle from normal due to the nature of a reflective mask, the combination of oblique illumination with a non-zero height metal layer 107, a shadowing effect exists which needs to be corrected by adjusting the size of the photomask features. Typically, the photomask is biased toward a smaller dimension in order to compensate for the shadowing effect. As EUVL technology extends to smaller design rules, the biasing requirement may place a limitation on EUVL mask fabrication.

Finally, for a subtractive metal reflective mask, while the absorptive metal layer is a conductive layer, its passivating silicon oxide layer is non-conducting. The non-conductive photomask may cause pinhole defects during mask transfer or handling processes due to charging. Any charge build up during handling and exposure can attract charged particles that are very difficult to remove.

BRIEF DESCRIPTION OF THE DRAWINGS

The invention is best understood by reference to the figures wherein references with like reference numbers generally indicate identical, functionally similar, and/or structurally similar elements.

DETAILED DESCRIPTION OF THE PREFERRED EMBODIMENTS

In accordance with the present invention, a method for forming an extreme ultraviolet lithography (EUVL) photomask is disclosed. In the following description of the preferred embodiments, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, operations are not shown or described in detail to avoid obscuring aspects of the invention.

Reference throughout this specification to "one embodiment", "an embodiment", or "preferred embodiment" means that a particular feature, structure, or characteristic described in connection with the embodiment is included in at least one embodiment of the present invention. Thus, the appearance of the phrase "in one embodiment", "in an embodiment", or "in a preferred embodiment" in various places throughout the specification are not necessarily all referring to the same embodiment. Furthermore, the particular features, structures, or characteristic may be combined in any suitable manner in one or more embodiments.

Figure 1:
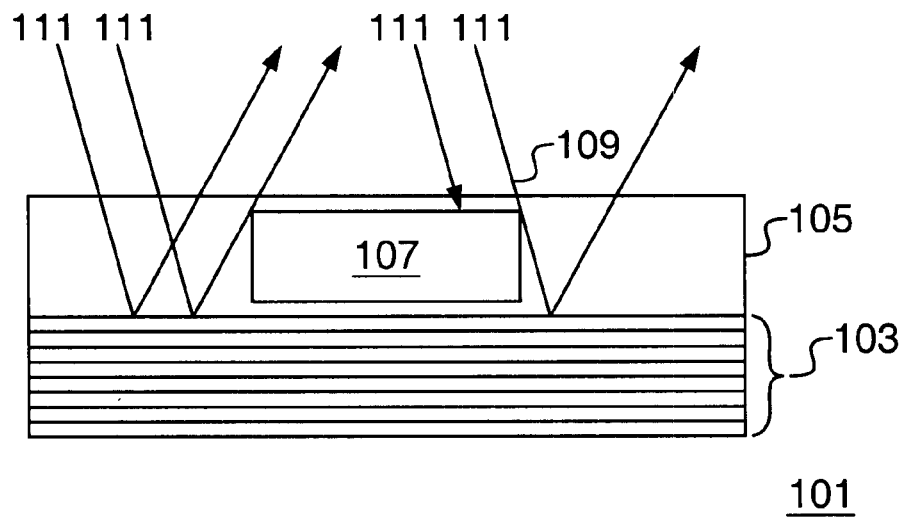
FIG. 1 is a prior art damascene EUVL photomask.
Figure 2:
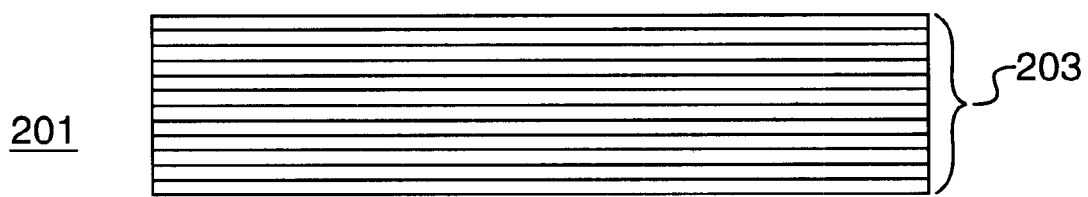
FIGS. 2–7 are cross sectional views illustrating a method for forming a EUVL photomask in accordance with the present invention.

Turning to FIG. 2, a EUVL mask blank 201 is provided. The EUVL mask blank consists of a plurality of pairs of molybdenum/silicon thin films. In the preferred embodiment, 40 pairs of molybdenum/silicon thin films comprise a multilayer stack 203 that forms the EUVL mask blank. However, other materials may be used to form the pairs of thin films and the present invention should not be limited to molybdenum/silicon thin films. For example, molybdenum/beryllium, niobium/beryllium, ruthenium/beryllium, rhodium/beryllium, or silicon/ruthenium thin film pairs may be used. Further, the pairs of thin films may include an interlayer between the first and second films to increase thermal stability and to prevent interdiffusion. The interlayer may be, for example, carbon.

Typically, each pair of molybdenum/silicon thin films is approximately 7 nm (or 70 angstroms) thick. Using known physical relationships, it has been found theoretically that 40 pairs (or 280 nm thickness) of molybdenum/silicon thin films will provide nearly 75% reflectivity for wavelengths in the EUV band (e.g., 13.4 nm).

Figure 3:
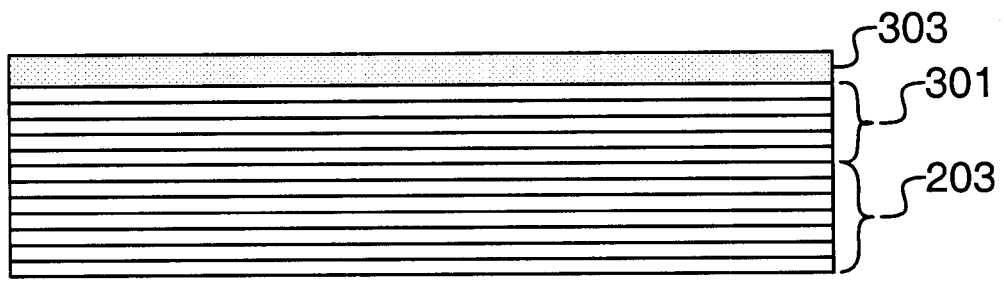

Next, turning to FIG. 3, in accordance with the present invention, an additional number of pairs of molybdenum/silicon thin films are deposited. In one embodiment, 10 pairs of thin films are deposited, resulting in an additional 70 nm in thickness. These 10 pairs of molybdenum/silicon thin films are referred to herein as supplemental multilayer stack 301. However, it should be stated that whatever the terminology used, the present invention discloses the use of a stack of molybdenum/silicon thin films.

Nevertheless, as noted above, other types of reflective thin film combinations may be used for the supplemental multilayer stack 301. Indeed, the thin film combination used for the supplemental multilayer stack 301 may be different from the thin film combination used for the multilayer stack 203. As will be seen below, trenches will be formed in the stack of thin films. Thus, unlike the prior art, the trenches are formed within the stack of thin films and not within a silicon base layer.

Additionally, a silicon capping layer 303 is deposited onto the supplemental multilayer stack 301. Preferably, the silicon capping layer 303 is on the order of 40 to 120 angstroms thick. The silicon capping layer 303 is useful in protecting the surface of the supplemental multilayer stack 301 during cleaning and other handling of the photomask.

Figure 4:
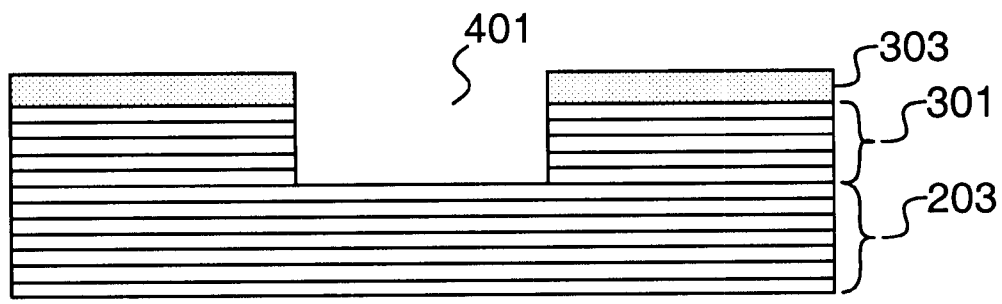

Next, referring to FIG. 4, a trench 401 is formed in the silicon capping layer 303 and the supplemental multilayer stack 301. While in this embodiment the trench 401 does not necessarily extend into the multilayer stack 203, the trench 401 may be of variable depth. The trench 401 is formed using conventional photoresist patterning and etching. Though not required, in this embodiment, the trench 401 extends down into the supplemental multilayer stack 301, but not into the multilayer stack 203. It can be appreciated that the trench 401 shown in FIG. 4 is merely illustrative and that in actual practice, trench 401 is typically a complicated network that defines the pattern of the photomask. Thus, trench 401 is formed throughout the photomask in the desired photomask pattern.

Figure 5:
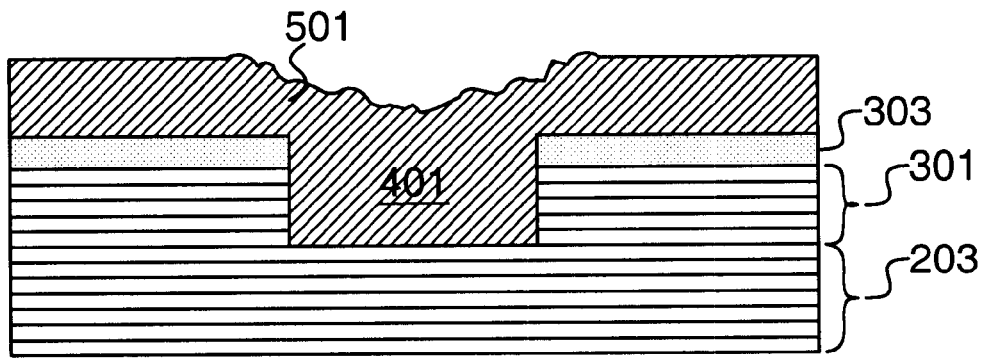

Next, turning to FIG. 5, the trench 401 is filled with a metal layer 501, typically using a blanket sputtering process. Alternative, physical vapor deposition or chemical vapor deposition may also be used. The metal layer 501 may be, for example, tantalum, tantalum nitride, tungsten, copper, chrome, aluminum, germanium, or silicon germanium. It has been found preliminarily that germanium and aluminum provide a preferred level of performance as the metal layer 501.

Indeed, any material that is generally absorptive of EUVL radiation may be used. However, it should be noted that the more absorptive the material used, the lower the thickness of the supplemental multilayer stack 301 need be.

Figure 6:
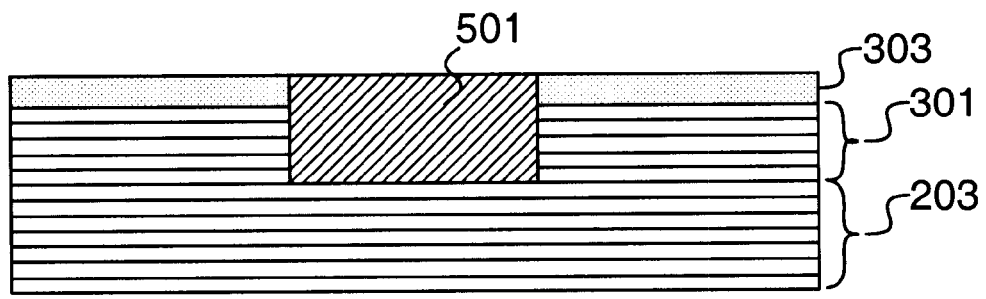

Next, turning to FIG. 6, the portion of the metal layer 501 that is outside trench 401 is removed. Typically, this is accomplished using a chemical mechanical polishing (CMP) process, using the cap silicon layer 303 as a polishing stop. The result is shown in FIG. 6.

Figure 7:
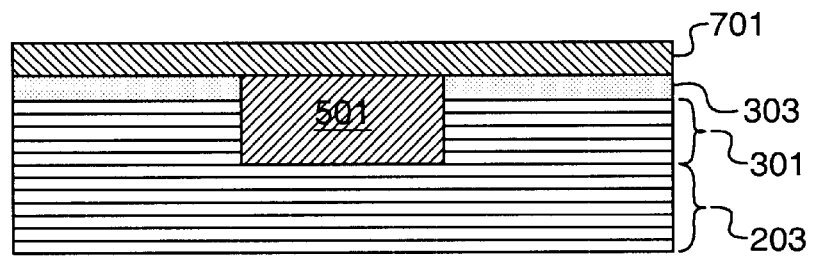

Finally, turning to FIG. 7, as an optional step, a thin amorphous silicon layer 701 is deposited over the cap silicon layer 303 and the metal layer 501 within the trenches. The thickness of the amorphous silicon layer 701 is preferably a few nanometers, in the range of 4 to 12 nanometers. The resulting photomask is shown in FIG. 7.

Several advantages of the photomask of FIG. 7 can be seen. First, unlike the prior art, there is no bulk silicon layer to act as a radiation attenuator. Instead, incident EUV radiation travels through, at most, the thin amorphous silicon layer 701 and the thin cap silicon layer 303 prior to being reflected by the supplemental multilayer stack 301. The thickness of the silicon capping layer 303 and the thin amorphous silicon layer 701 is on the order of 10–15 nanometers, which results in significantly less attenuation than that of the prior art bulk silicon layer, which was typically on the order of 70 to 100 nm.

Second, because the incident EUV radiation is reflected by the supplemental multilayer stack 301, which is at substantially the same planar level as the metal layer 501, the shadowing effect is nearly nonexistent. Any shadowing effect caused by the cap silicon layer 303 is negligible due to the thinness of the cap silicon layer 303.

Third, because the multilayer stack 203 and the supplemental multilayer stack 301 are conductive, the overall conductivity of the photomask is increased, which facilitates protection of the photomask from particle contamination.

Fourth, the photomask design of the present invention is amenable to optical inspection and focused ion beam (FIB) repair technology for opaque etched defects. Other known techniques for repairing clear defects may also be used. For example, one method is described in U.S. Pat. No. 5,935,737 to Yan and assigned to the same assignee as the present invention.

Fifth, because the surface of the photomask is substantially flat, it can be easily cleaned, when compared to conventional subtractive metal processes used for photomask fabrication. Moreover, because of the cap silicon layer 303 and the optional amorphous silicon layer 701, cleaning processes will not damage the underlying supplemental multilayer stack 301 nor the metal absorber 501.

The present invention can be modified slightly to aid in the inspection and repair of the photomask during its manufacture. In particular, turning to FIG. 8, in addition to the multilayer stack 203, the supplemental multilayer stack 301, and the cap silicon layer 303, a contrasting layer 801 is also deposited. The contrasting layer 801 is a material that can provide good contrast between the etched and unetched regions using optical inspection techniques. In one embodiment, the contrast layer 801 can be formed from carbon. Titanium nitride, tantalum nitride, or chromium may also be used as a contrast layer 801.

Figure 8:
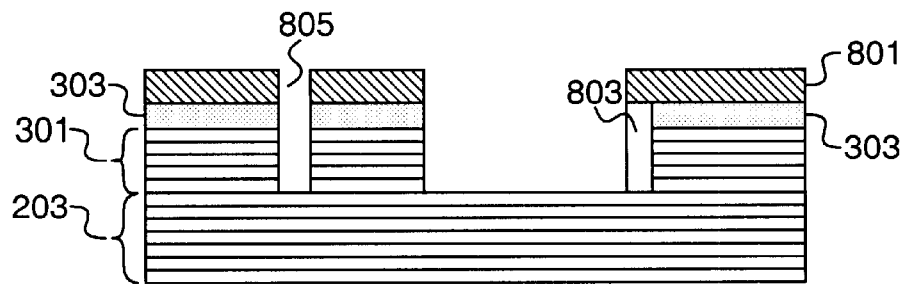
FIG. 8 is a cross sectional view of a photomask during manufacture showing a protrusion defect and an intrusion defect.

After patterning and etching of the photomask, optical inspection can be conducted because a high optical contrast can be obtained between the etched region and the unetched region covered by the contrast layer 801. In FIG. 8, two types of defects are shown: a protrusion defect 803 and an intrusion defect 805. A protrusion defect is an area of the photomask that should be etched, but has not been etched. An intrusion defect is an area of the photomask that should not be etched, but has been etched. A protrusion defect can be repaired using conventional focused ion beam (FIB) technology to remove the protrusion defect 803. An intrusion defect 805 should be avoided in the patterning process by using other known techniques. For example, one method is described in U.S. Pat. No. 5,935,737 to Yan and assigned to the same assignee as the present invention. However, the use of the contrast layer 801 is useful for identifying the defects using optical techniques.

The remaining steps shown in FIGS. 2–7 may then be carried out after the defects are removed. Thus, the metal layer 501 is deposited over the photomask and a metal CMP process is performed. The contrasting layer 801, in one embodiment carbon, may also serve as a CMP stop layer. After the CMP process is stopped on the contrast layer 801, the surface of the metal layer 501 is significantly more planar. This in turn insures increased uniformity control in the next contrast layer 801 polishing step to remove the contrast layer 801. In this example, the cap silicon layer 303 is used as the stop layer. Any carbon residue can be removed via oxygen plasma etching.

Alternatively, the contrast layer 801 may be removed by a conventional lift-off process. In this case, the thickness of the contrast layer is preferably less than 20 nanometers. Although this method results in a surface that is not as planar as obtained using a CMP process, this technique is still more planar than a photomask fabricated using a subtractive metal technique. The advantage of removing contrast layer 801 by a lift-off process is to retain a good film uniformity of the silicon capping layer 303. A wet or dry etch process usually can achieve higher selectivity to the silicon capping layer as compared to the CMP process.

Still alternatively, before removing the contrast layer by lift-off process, a blanket etch of the metal layer 501 may be performed so as to recess the metal layer 501 under the silicon capping layer 303 or the supplemental multilayer stack 301. The recess depth can be in a range of 0–30 nm. The contrast layer is then removed using a lift-off process by either a dry or wet etch. For certain metals forming the metal layer 501, the recessed metal layer has performance advantages.

Finally, like the embodiment described above, a thin amorphous silicon coating may be placed over the photomask as an optional step. Another advantage of using the contrast layer 801 is that the contract layer 801 can be used as a "etching test layer". Thus, any errors in the etching pattern to be imprinted onto the photomask can be determined by first etching the contrast layer 801. If errors are found, then the contrast layer 801 can be repaired. Then, the contrast layer 801 can be used as a hard mask to etch the underlying supplemental multilayer stack 301.

Figure 9:
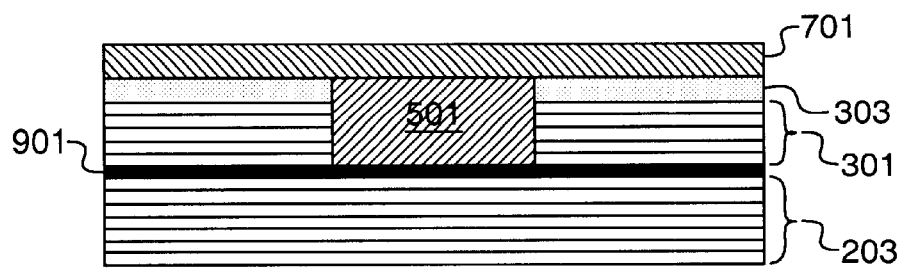
FIG. 9 is a cross sectional view of a photomask formed in accordance with an alternative embodiment of the present invention.

Turning to FIG. 9, an alternative embodiment of the present invention is shown. In this embodiment, an etching stop layer 901 is formed between the supplemental multiplayer stack 301 and the multiplayer stack 203. This etching stop layer 901 (also referred to herein as a buffer layer) is formed to a thickness dependent upon the wavelength of the illuminating radiation, the real portion of the index of refraction of the etching stop layer (n), and the angle of incidence of the illuminating radiation (θ) by the following relationship:

$$\text{Thickness} = m\lambda/(2n \cos \theta)$$

where m is an integer.

Thus, for an angle of incidence of 5 degrees, an exposure wavelength of 134 angstroms, using oxide as the buffer layer having a real index of refraction of 0.9735, the optimal thickness is about 7 nm. For a ruthenium etch stop layer, the optimal thickness is still approximately 7 nm. The etching stop layer 901 can be formed from an oxide, carbon, chromium, ruthenium, or other materials.

The formula given above is valid for a multilayer stacks 301 and 203 that has a substantially uniform periodicity. Periodicity refers to a consistent pattern of thin film thickness for the molybdenum/silicon thin film pairs. In one example, this results in pairs of 2.8 nm molybdenum thin film and 4.2 nm silicon thin film. For other types of materials forming the thin film pairs, it can be appreciated that other thicknesses are used. In any event, a uniform periodicity refers to having consistent thicknesses in the thin film pairs throughout the multilayer stacks 301 and 203.

In broader terms, the thickness of the buffer layer, including for any overages or underages in thickness relative to uniform periodicity in the thin film layers directly adjoining the buffer layer, should have an optical path that is a multiple of 2π. Thus, as an example, assume that the topmost thin film layer in the multilayer stack 203 is 5.2 nm, instead of the nominal 4.2 nm thickness. In such a situation, 1.0 nm of this thickness should be accounted for as part of the buffer layer in calculating its optical path.

The etching stop layer 901 serves at least two functions. First, when the trenches 401 are formed in the supplemental multilayer stack 301, the precise depth of the trenches 401 can be uniformly controlled. Second, if an error is made in the etching process of the trenches 401 is discovered, the supplemental multilayer stack 301 can be stripped away and a new supplemental multilayer stack 301 can be formed on the multilayer stack 203. Thus, errors in patterning can be corrected without destroying an expensive mask blank. Conceivably, mask blanks may be even reused.

While specific embodiments of, and examples for, the invention are described herein for illustrative purposes, various equivalent modifications are possible within the scope of the invention, as those skilled in the art will recognize. These modifications can be made to the invention in radiation of the detailed description. The terms used in the following claims should not be construed to limit the invention to specific embodiments disclosed in the specification and the claims. Rather, the scope of the invention is to be determined entirely by the following claims, which are to be construed in accordance with established doctrines of claim interpretation.

What is claimed is:

1. A photolithography mask for use with extreme ultraviolet lithography (EUVL), comprising:
   a multilayer stack that is substantially reflective of said EUVL irradiation;
   a supplemental multilayer stack formed atop said multilayer stack; and
   an absorber material formed in trenches patterned into said supplemental multilayer stack, said absorber material being substantially absorptive of said EUVL irradiation.

2. The mask of claim 1 further comprising a cap silicon layer formed over said supplemental multilayer stack.

3. The mask of claim 2 further comprising a thin amorphous silicon layer formed over said cap silicon layer and said absorptive material.

4. The mask of claim 1 wherein said multilayer stack and said supplemental multilayer stack are formed from pairs comprising a molybdenum thin film and a silicon thin film.

5. The mask of claim 1 wherein said absorptive layer is formed from chromium, tungsten, tantalum, tantalum nitride, aluminum, germanium, silicon germanium or copper.

6. The mask of claim 1 wherein the top of said absorptive layer is substantially planar with the top of said supplemental multilayer stack.

7. The mask of claim 1 further including an etching stop layer formed between said multilayer stack and said supplemental multilayer stack.

8. The mask of claim 7 wherein said etching stop layer has a thickness dependent upon the wavelength of the EUVL irradiation, the real portion of the index of refraction of the etching stop layer (n), and the angle of incidence of the EUVL irradiation (θ) by the following relationship:

$$\text{Thickness} = m\lambda/(2n \cos \theta)$$

where m is an integer.

9. The mask of claim 7 wherein said etching stop layer has a thickness that provides an optical path that is an integer multiple of $2\pi$.

10. The mask of claim 7 wherein said etching stop layer is formed from carbon, chromium, oxide, or ruthenium.

11. A photolithography mask comprising:
   a multilayer stack;
   a supplemental multilayer stack formed atop said multilayer stack; and
   an absorptive layer disposed in trenches formed within said supplemental multilayer stack.

12. The photolithography mask of claim 11 wherein said multilayer stack and said supplemental multilayer stack are formed from pairs comprising a molybdenum thin film and a silicon thin film.

13. The photolithography mask of claim 11 wherein said absorptive layer is formed from chromium, tantalum, tantalum nitride, tungsten, aluminum, germanium, silicon germanium or copper.

14. The photolithography mask of claim 11 further comprising a cap silicon layer formed atop of said supplemental multilayer stack.

15. The photolithography mask of claim 14 wherein the top of said absorptive layer is substantially planar with the top of said cap silicon layer.

16. The photolithography mask of claim 11 wherein the top of said absorptive layer is substantially planar with the top of said supplemental multilayer stack.

17. The mask of claim 11 further including an etching stop layer formed between said multilayer stack and said supplemental multilayer stack.

18. The mask of claim 17 wherein said etching stop layer has a thickness dependent upon the wavelength of the EUVL irradiation, the real portion of the index of refraction of the etching stop layer (n), and the angle of incidence of the EUVL irradiation (θ) by the following relationship:

$$\text{Thickness} = m\lambda/(2n \cos \theta)$$

where m is an integer.

19. The mask of claim 17 wherein said etching stop layer has a thickness that provides an optical path that is an integer multiple of $2\pi$.

20. The mask of claim 17 wherein said etching stop layer is formed from carbon, chromium, oxide, or ruthenium.

21. A method for forming a photolithography mask comprising:
   providing a multilayer stack comprised of a plurality of pairs of thin films;
   forming a supplemental multilayer stack on said multilayer stack;
   patterning and etching trenches in said supplemental multilayer stack, said trenches forming a photolithography mask pattern; and
   forming an absorptive layer into said trenches.

22. The method of claim 21 further comprising forming a cap silicon layer over said multilayer stack prior to the formation of said trenches.

23. The method of claim 22 further comprising forming a thin amorphous silicon layer over said cap silicon layer and said absorptive layer.

24. The method of claim 22 further comprising depositing a contrast layer atop said cap silicon layer prior to formation of the trenches.

25. The method of claim 21 wherein said absorptive layer comprises aluminum, titanium, tungsten, chromium, copper, germanium, silicon germanium, tantalum, or tantalum nitride.

26. The method of claim 21 wherein the forming of said absorptive layer comprises:
   depositing said absorptive layer over said multilayer stack and into said trenches; and
   performing a chemical mechanical polishing step to remove a portion of said absorptive layer outside of said trenches.

27. The method of claim 21 further comprising depositing a contrast layer atop said multilayer stack prior to formation of the trenches.

28. The method of claim 27 further comprising repairing defects in said photolithography mask after the formation of said trenches.

29. The method of claim 27 wherein protrusion defects are repaired using a focused ion beam.

30. The method of claim 29 wherein said etching stop layer is formed from carbon, chromium, oxide, or ruthenium.

31. The method of claim 27 wherein said contrast layer is removed by a lift-off technique.

32. The method of claim 27 further comprising:
etching said absorptive layer such that said absorptive layer is recessed into said trenches; and
removing said contrast layer.

33. The method of claim 21 further including forming an etching stop layer between said multilayer stack and said supplemental multilayer stack.

34. The method of claim 33 wherein said etching stop layer has a thickness dependent upon the wavelength of the EUVL irradiation, the real portion of the index of refraction of the etching stop layer (n), and the angle of incidence of the EUVL irradiation ($\theta$) by the following relationship:

$$\text{Thickness} = m\lambda/(2n \cos \theta)$$

where m is an integer.

35. The mask of claim 33 wherein said etching stop layer has a thickness that provides an optical path that is an integer multiple of $2\pi$.

* * * * *